(12) United States Patent
Vook et al.

(10) Patent No.: US 6,566,723 B1
(45) Date of Patent: May 20, 2003

(54) DIGITAL COLOR IMAGE SENSOR WITH ELEVATED TWO-COLOR PHOTO-DETECTOR AND RELATED CIRCUITRY

(75) Inventors: Dietrich W. Vook, Menlo Park, CA (US); Izhak Baharav, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/043,810

(22) Filed: Jan. 10, 2002

(51) Int. Cl.[7] .............................................. H01L 31/00
(52) U.S. Cl. ...................... 257/440; 257/293; 250/226
(58) Field of Search ................................ 257/440, 293; 250/214.1, 370.01, 332

(56) References Cited

U.S. PATENT DOCUMENTS

| | | | | |
|---|---|---|---|---|
| 3,962,578 A | * | 6/1976 | Roschen | 250/214.1 |
| 5,373,182 A | * | 12/1994 | Norton | 257/440 |
| 5,581,084 A | * | 12/1996 | Chapman et al. | 250/332 |
| 5,646,421 A | * | 7/1997 | Liu | 257/17 |
| 5,959,339 A | * | 9/1999 | Chapman et al. | 250/370.01 |
| 6,103,544 A | * | 8/2000 | Dreiske et al. | 438/438 |

* cited by examiner

*Primary Examiner*—David Nelms
*Assistant Examiner*—Tu-Tu Ho

(57) ABSTRACT

A digital color image sensor is disclosed having an elevated two-color photo-detector in combination with a single-color photo-detector. At least part of the circuitry associated with the two-color photo-detector may be integrated under the single-color photo-detector, which results in a smaller and less expensive photo-detector for a color image sensor. In addition, the two-color photo-detector photo-detectors are electrically isolated from each other, thereby improving the dynamic range of each photo-detector. The isolation is achieved by implementing one of the photo-detectors of the two-color photo-detector within the bulk silicon and elevating the other photo-detector of the two-color photo-detector above the bulk silicon.

21 Claims, 6 Drawing Sheets

DIGITAL COLOR IMAGE SENSOR WITH ELEVATED TWO-COLOR PHOTO-DETECTOR AND RELATED CIRCUITRY

BACKGROUND OF THE INVENTION

1. Technical Field of the Invention

The present invention relates generally to digital color image sensors, and specifically to a two-color photo-detector and related circuitry for use in digital color image sensors.

2. Description of Related Art

Digital color image sensors are predominately of two types: CCDs (Charge Coupled Devices) and CMOS—APS (Complimentary Metal Oxide Semiconductor—Active Photo-detector Sensors). Both types of sensors typically contain an array of photo-detectors (e.g., pixels), arranged in rows and columns or arranged in another pattern, that sample color within an image. Each photo-detector measures the intensity of light within one or more ranges of wavelengths, corresponding to one or more perceived colors. In addition, both types of sensors may include a color filter array (CFA), such as the CFA described in U.S. Pat. No. 3,971,065 to Bayer (hereinafter referred to as Bayer), which is hereby incorporated by reference. With the Bayer CFA, each photo-detector sees only one wavelength range, corresponding to the color red, green or blue.

A sensor fitted with a Bayer CFA produces a mosaiced image that is sampled in both the color space and in the spatial domain. The sampling process produces aliasing artifacts in both the color space and in the spatial domain. For example, since only portions of the full color spectrum are sampled at any given photo-detector location (depending on the CFA), it is impossible to accurately reconstruct the true color of an image, thereby producing color space aliasing artifacts. In addition, since high spatial frequencies in the original image are sampled at too low of a frequency, the original high frequencies in the image cannot be restored later on through image processing, thereby producing spatial domain aliasing artifacts. One solution to the color space and spatial domain aliasing artifact problems is alternative sensor designs.

In one alternative sensor design that does not use a CFA, a special prism separates and captures the three primary colors at the same photo-detector location, as is described by Richard F. Lyon in "Prism-Based Color Separation for Professional Digital Photography," Proceedings of 2000 PICS Conference, IS&T, p. 50–54, which is hereby incorporated, by reference. However, the cost of the prism and optics is extremely high. In addition, the need to manually align, in both X and Y, the three sensors and optics to less than a fraction of the width of a photo-detector, which is on the order of 3 microns, is prohibitive for many imaging applications.

Another type of sensor design is described in both U.S. Pat. No. 5,998,806 to Stiebig et al. and U.S. Pat. No. 5,965,875 to Merrill, which are both hereby incorporated by reference. The Stiebig et al. and Merrill sensors stack three separate color photodiodes, and electrically connect the photodiodes together to form one photo-detector capable of sensing all three primary colors at a single spatial location. However, both the Stiebig et al. sensor and Merrill sensor include common anodes, such that any current coming out of a three-color photo-detector location is a combination of more than one photodiode current. Therefore, in order to measure the differences in current coming out of each of the photodiodes, a significant amount of extra circuitry is required, which can be both cost prohibitive and area prohibitive.

A further alternative sensor design is described in an article by K. M. Findlater et al. entitled "Buried Double Junction Photo-detector Using Green and Magenta Filters," 1999 IEEE Workshop on CCDs and Advanced Image Sensors, p. 60–64, which is hereby incorporated by reference. Instead of a "three color photo-detector," as described in Stiebig et al. and Merrill, the Findlater article describes a "two color photo-detector." In the Findlater sensor, each photo-detector includes two back to back photodiodes resident in the bulk silicon. In addition, a non-Bayer color filter array (CFA) mosaic covers the Findlater sensor. Thus, for every two photo-detectors, four different color values are extracted. Although the Findlater design provides more accurate color reconstruction as compared to a sensor fitted with a "Bayer" CFA, the color separation of the two bulk photodiodes is poor, since the colors are differentiated only by the differences in absorption with wavelength. In addition, with the Findlater design, the photo-detector itself is quite large due to the fact that two bulk photodiodes and six MOSFETs are integrated into the area of each photo-detector, adding both area and cost.

A further alternative sensor design is described in commonly assigned U.S. Pat. application Ser. No. 10/086,125, filed concurrently herewith, which is hereby incorporated by reference. The sensor design uses elevated two-color photo-detectors with a non-Bayer CFA mosaic. Each photo-detector location contains two sub-photo-detectors, each sensing a different color. One of the sub-photo-detectors of each photo-detector location is elevated above a dielectric layer to electrically isolate the sub-photo-detectors from each other. However, as with the Findlater design, the size of each photo-detector is large due to the number of transistors required to drive each photo-detector. In addition, for a similar area, higher spatial resolutions may be produced using a standard, single-color photo-detector design. Therefore, what is needed is a digital image sensor capable of sensing more than one color at a single photo-detector location with reduced photo-detector area.

SUMMARY OF THE INVENTION

The present invention provides a digital color image sensor having an elevated two-color photo-detector in combination with a single-color photo-detector to reduce the photo-detector area as compared to previous two-color sensor designs. In some embodiments, at least part of the circuitry associated with the two-color photo-detector is integrated under the single-color photo-detector. By implementing at least part of the circuitry associated with the two-color photo-detector under the single-color photo-detector, a smaller and less expensive two-color photo-detector can be produced. In addition, the two-color photo-detector photo-detectors are electrically isolated from each other, thereby improving the dynamic range of each photo-detector. The isolation is achieved by implementing one of the photo-detectors of the two color photo-detector within the bulk silicon and elevating the other photo-detector of the two-color photo-detector above the bulk silicon. Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE EXEMPLARY EMBODIMENTS OF THE INVENTION

The numerous innovative teachings of the present application will be described with particular reference to the exemplary embodiments. However, it should be understood that these embodiments provide only a few examples of the many advantageous uses of the innovative teachings herein. In general, statements made in the specification do not necessarily delimit any of the various claimed inventions. Moreover, some statements may apply to some inventive features, but not to others.

Figure 1:
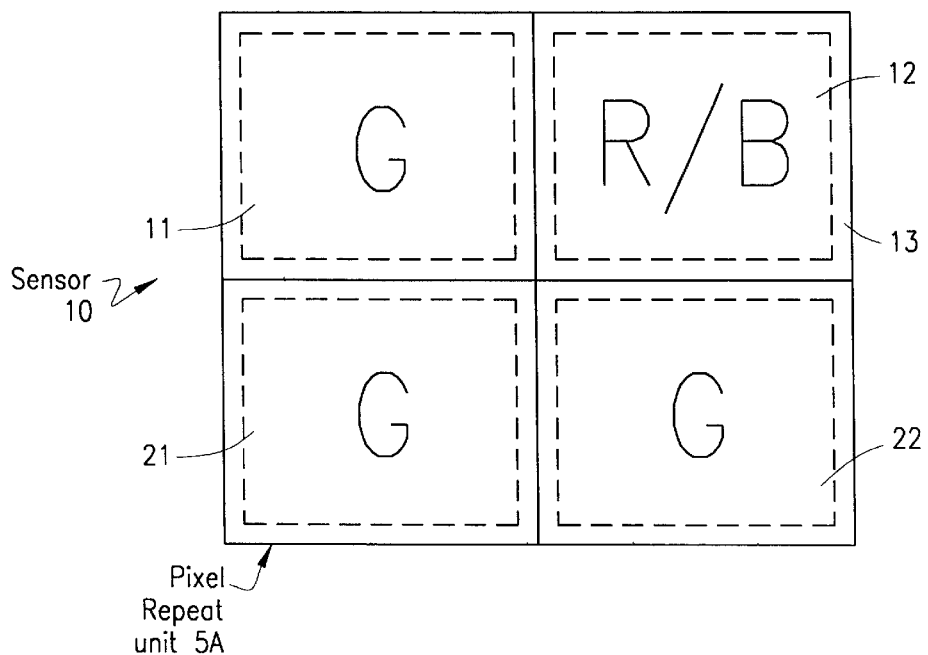
FIG. 1 illustrates a repeat unit of an image sensor having one two-color photo-detector in combination with three single-color photo-detectors in accordance with embodiments of the present invention.

FIG. 1 illustrates a repeat unit 5A for a digital image sensor 10 having a two-color photo-detector (e.g., pixel) R/B in combination with three single-color photo-detectors G, in accordance with embodiments of the present invention. The repeat unit 5A is stepped and repeated throughout the array of photo-detectors. In FIG. 1, within the area of four photo-detectors are five photo-detector elements (i.e., photodiodes, photo-conductors, photo-transistors or any other photo-electric device). One of the photo-detectors is a two-color photo-detector R/B having two photo-detector elements 12 and 13 that each detect a different color, and the other three photo-detectors are single-color photo-detectors G, each having a single photo-detector element 11, 21 and 22, that detects a color different from the two colors detected by the two-color photo-detector R/B. In the example shown in FIG. 1, the two-color photo-detector R/B includes a magenta filter, so that only the red and blue portions of the spectrum are passed to the two photo-detectors 12 and 13. However, it should be understood that other filters may be used depending on the color space and color sampling desired for the sensor.

A single layer of the appropriate thickness of amorphous silicon ($\alpha$Si:H) serves as an upper photo-detector element 12 of the two-color photo-detector. In the example of FIG. 1, the upper photo-detector element 12 absorbs the blue portion of the spectrum and passes the red portion of the spectrum to a lower photo-detector element 13 of the two-color photo-detector. The lower photo-detector element 13 of the two-color photo-detector resides in the bulk silicon, which has a longer absorption length than amorphous silicon. Therefore, the red portion of the spectrum is absorbed in the lower photo-detector element 13. As can be seen, the upper photo-detector element 12 of the two-color photo-detector R/B is in an elevated relation (i.e., above and spaced apart from) with the lower photo-detector element 13 of the two-color photo-detector R/B.

Advantageously, the amorphous silicon layer of the two-color photo-detector provides independent control of both the upper 12 and lower 13 photo-detectors. In addition, the use of amorphous silicon allows for a tunable color response, through the thickness of the amorphous silicon layer. For example, in other embodiments, the two-color photo-detector may not include a color filter. Without a color filter, in order to tune the color response of the two-color photo-detector, the thickness of the amorphous silicon layer of the upper photo-detector element 12 may be altered. For example, a thin amorphous silicon layer for the upper photo-detector element 12 would absorb only blue, while the bulk lower photo-detector element 13 below would absorb the compliment of blue (e.g., yellow). Alternatively, if the thickness of the amorphous silicon layer of the upper photo-detector element 12 is increased, the upper photo-detector element 12 would extract the compliment of red (e.g., cyan), while the bulk lower photo-detector element 13 below would absorb red.

Figure 2:
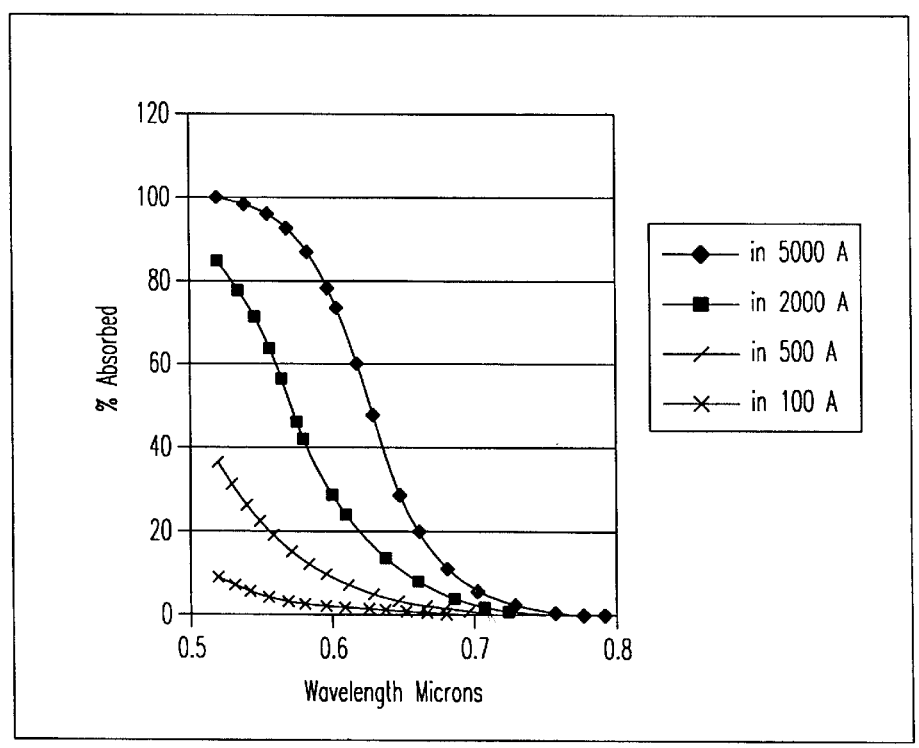
FIG. 2 is a chart of absorption percentage versus wavelength for varying thickness of amorphous silicon.

A chart of the absorption percentage versus wavelength for varying thickness of the amorphous silicon layer is shown in FIG. 2. As can be seen in FIG. 2, a 5000 angstrom thick layer of amorphous silicon absorbs 100 percent of the blue portion of the spectrum (near 0.5 microns wavelength), between 40 and 80 percent of the green (between approximately 0.55 and 0.65 microns wavelength) and less than 20 percent of the red portion of the spectrum (between approximately 0.65 and 0.75 microns wavelength).

Referring again to FIG. 1, green filters are shown above the three single-color photo-detectors G. The green filters absorb the blue and red portions of the spectrum, while passing the green portion of the spectrum to the green photo-detector elements 11, 21, and 22. Each green photo-detector element is made up of an elevated layer of amorphous silicon. The thickness of the amorphous silicon layer of the green photo-detector elements is chosen such that the amorphous silicon layer absorbs the green portion of the spectrum. Although the single-color photo-detector elements 11, 21 and 22 are discussed absorbing a first range of wavelengths (e.g., green wavelengths) and the two-color photo-detector elements 12 and 13 are discussed absorbing second and third ranges of wavelengths (e.g., red and blue wavelengths), it should be understood that any of the photo-detector elements can absorb any range of wavelengths depending upon the design and usage of the sensor 10. In addition, it should be understood that the respective wavelength ranges absorbed by the two-color photo-detector elements 12 and 13 can partially overlap the wavelength range absorbed by the single-color photo-detector elements 11, 21 and 22 without any significant impact to the sensitivity of the sensor 10.

The green photo-detectors G are used to gather luminance information as well as to supply the area for all of the driver transistors, such as Metal-Oxide Semiconductor Field-Effect Transistors (MOSFETs). The driver MOSFETs are implemented in the bulk silicon under the green photo-detector elements. Therefore, advantageously, all of the MOSFETs are included under the green photo-detector elements and no MOSFETs are included under the two-color upper and lower photo-detector elements. This reduces the photo-detector area required for the two-color photo-detector R/B, as compared with previous two-color and three-color photo-detector designs, as described above.

Figure 3:
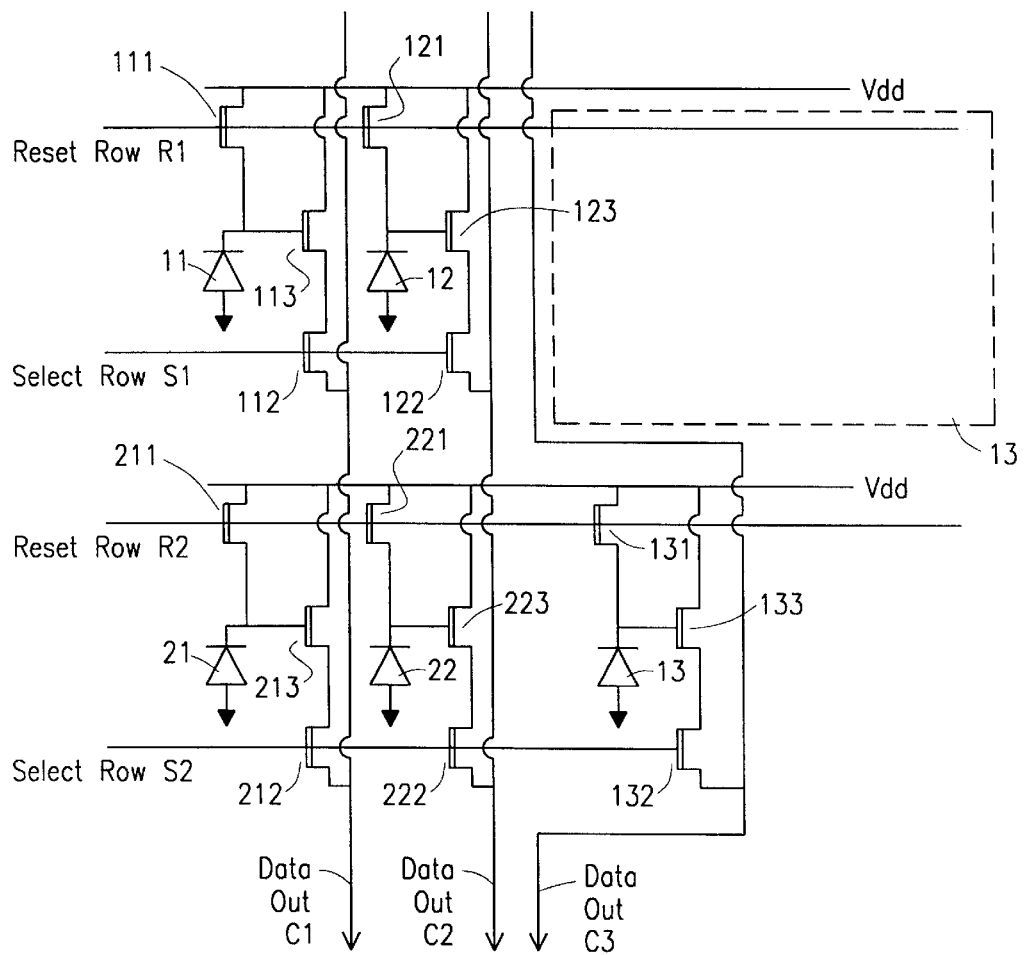
FIG. 3 is an exemplary circuit schematic of the image sensor shown in FIG. 1.

As is well known in the art, a photo-detector with two photo-detector elements (e.g., photodiodes) needs approximately six MOSFET's to drive the photodiodes (three per photodiode). Therefore, a sensor, as shown in FIG. 1, with three single-color photo-detectors G and one two-color photo-detector R/B needs approximately fifteen MOSFET's to drive all of the photodiodes. An exemplary circuit schematic of the transistors needed to drive the sensor of FIG. 1 is shown in FIG. 3. The circuit schematic is shown implemented in the bulk silicon of the sensor. Therefore, the location of the lower photo-detector element 13 (bulk photodiode) of the two-color photo-detector with respect to the circuitry is illustrated.

Reset MOSFETs 111, 121, 211, 221 and 131 serve to reset photodiodes 11, 12, 21, 22 and 13, respectively, whereas selector MOSFETs 112, 122, 212, 222 and 132 serve to select photodiodes 11, 12, 21, 22 and 13, respectively. Amplifier MOSFETs 113, 123, 213, 223 and 133 serve to amplify the signals from photodiodes 11, 12, 21, 22 and 13, respectively. A supply voltage (Vdd) is provided to bias the reset and amplifier MOSFETs.

When the voltage of photodiodes 11 and 12 is reset by applying a signal to reset line R1, which is connected to the gates of reset MOSFETs 111 and 121, respectively, light impinging on the photodiodes 11 and 12 causes the photodiodes 11 and 12 to accumulate charge. The accumulated charge reduces the voltage over time, so that when a signal is applied to select line S1, which is connected to the gates of selector MOSFETs 112 and 122, voltages related to the photodiode voltages associated with photodiodes 11 and 12 are transferred to storage capacitors (not shown) via respective column data lines C1 and C2. Thereafter, the photodiodes 11 and 12 are reset again, and the reset voltages are transferred to other storage capacitors (not shown). The difference between the photodiode voltage and the reset voltage is then provided to an analog-to-digital converter (not shown) for processing.

Likewise, to read the data from photodiodes 21, 22 and 13, a signal is applied to reset line R2 of reset MOSFETs 211, 221 and 131 to reset photodiodes 21, 22 and 13, and after a subsequent delay (for integrating the optical signal), a signal is applied to the select line S2 of selector MOSFETs 212, 222 and 132. The photodiode voltages from photodiodes 21, 22 and 13 are then transferred to the storage capacitors on respective column data lines C1, C2 and C3.

Figure 4:
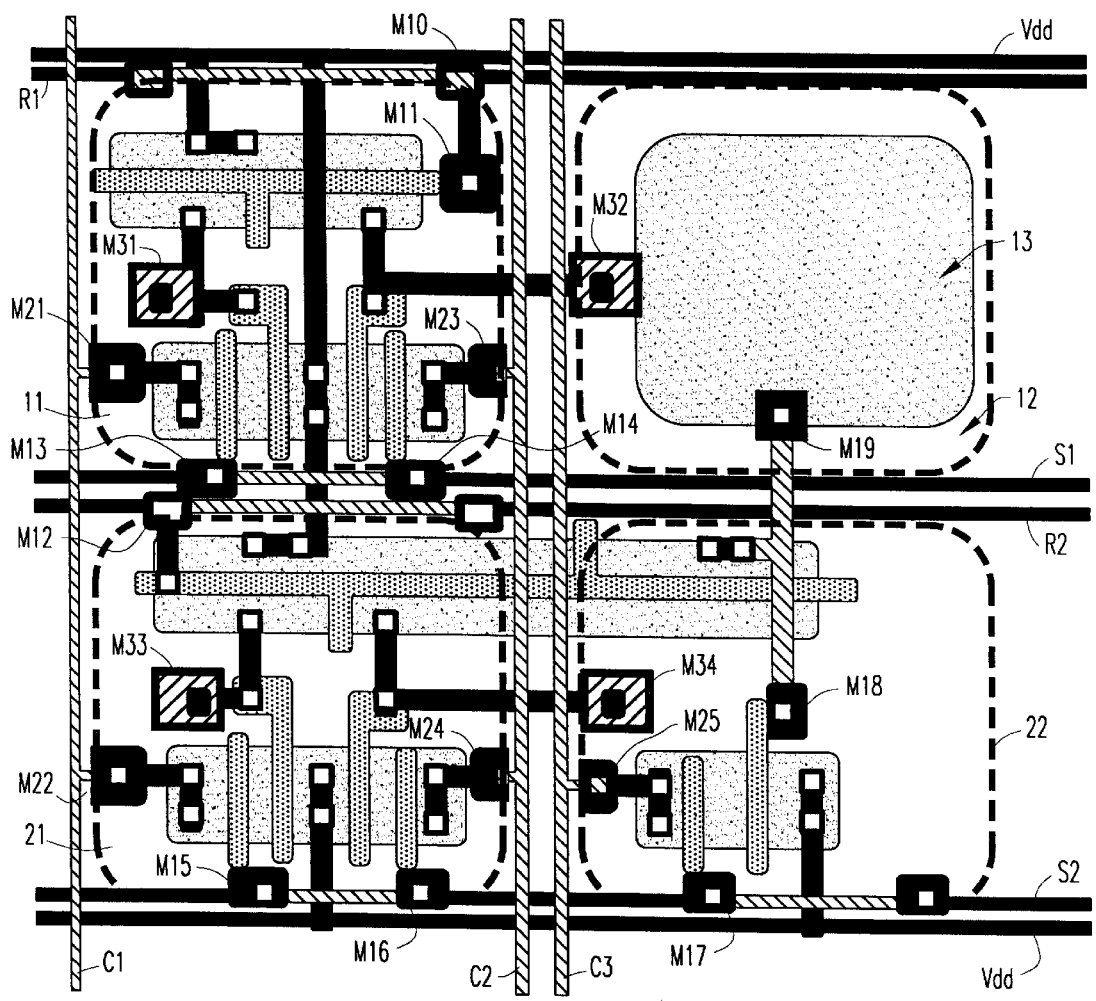
FIG. 4 illustrates an exemplary layout of the image sensor shown in FIGS. 1 and 3.

An exemplary layout for the sensor shown in FIG. 1 is illustrated in FIG. 4. The dashed lines represent elevated photodiodes 11, 12, 21 and 22. The shaded areas represent diffusion regions, where the source and drain of all fifteen MOSFETs and the lower photo-detector element (photodiode) of the two-color photo-detector are formed. Three layers of metal (metal 1, metal 2 and metal 3) are illustrated in FIG. 4. Metal 1 is represented by solid lines, metal 2 is represented by left-hatched lines and metal 3 is represented by right-hatched areas. In addition, polysilicon gates to each of the fifteen MOSFETs are illustrated by dotted areas. All of the metal contacts shown will not be described, for simplicity.

Metal contacts M31, M32, M33 and M34 provide a connection between elevated photodiodes 11, 12, 21 and 22, respectively, and the polysilicon gates of amplifier MOSFETs 113, 123, 213 and 223 (shown in FIG. 3), respectively.

Metal contacts M31, M32, M33 and M34 further provide a connection between metal 1, metal 2 and metal 3. Metal contacts M18 and M19 provides the signal from lower photo-detector element 13 to the polysilicon gate of amplifier MOSFET 133 (shown in FIG. 3), and serve as metal 1 to metal 2 contacts.

Reset lines R1 and R2 and select lines S1 and S2 are formed of metal 1 (solid lines) and metal 2 (left-hatched lines) to avoid intersecting crossing lines from the supply voltage (Vdd), as is shown. Reset line R1 connects to the polysilicon gates of reset MOSFETs 111 and 121 via metal contacts M10 and M11. Reset line R2 connects to the polysilicon gates of MOSFETs 211, 221 and 131 (shown in FIG. 3) via metal contact M12, respectively. Select reset line S1 connects to the polysilicon gates of MOSFETs 112 and 122 (shown in FIG. 3) via metal contacts M13 and M14, respectively, and select reset line S2 connects to the polysilicon gates of MOSFETs 212, 222 and 132 (shown in FIG. 3) via metal contacts M15, M16 and M17, respectively. In addition, metal contacts M10, M12, M13, M14, M15, M16 and M17 also connect metal 1 to metal 2.

Column data lines C1–C3 are formed of metal 2. Data is placed on column data line C1 from photodiodes 11 and 21 via metal contacts M21 and M22, respectively. Similarly, data is placed on column data line C2 from photodiodes 12 and 22 via metal contacts M23 and M24, respectively. Furthermore, data is placed on column data line C3 from photodiode 13 via metal contact M25. Metal contacts M21, M22, M23, M24 and M25 further serve as metal 1 to metal 2 contacts. It should be understood that alternative circuit schematics and layouts may be possible, and that the circuit schematic and layout shown in FIGS. 3 and 4 are included merely for illustrative purposes.

Figure 5:
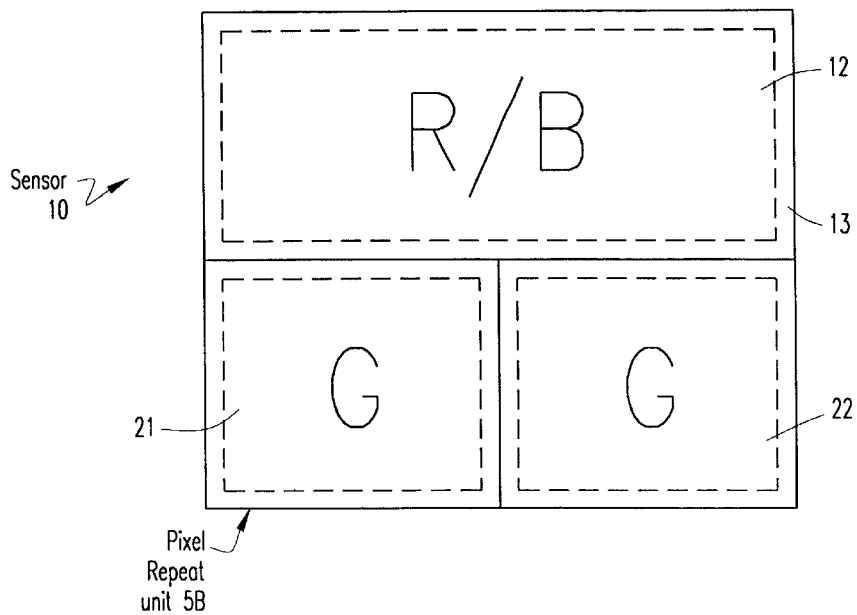
FIG. 5 illustrates a repeat unit of an image sensor having one two-color photo-detector in combination with two single-color photo-detectors in accordance with embodiments of the present invention.

FIG. 5 illustrates another exemplary repeat unit 5B of a digital image sensor 10 having one two-color photo-detector R/B in combination with two single-color photo-detectors G, in accordance with embodiments of the present invention. In FIG. 5, there are three photo-detectors and four photo-detector elements (e.g., photodiodes). One of the photo-detectors is a two-color photo-detector R/B having two photo-detector elements 12 and 13 that detect two different colors, and the other two photo-detectors are single-color photo-detectors G, each having a single photo-detector element 21 and 22 that detects a color different from the two colors detected by the two-color photo-detector R/B. The area of the two-color photo-detector R/B is shown equivalent to the area of both single-color photo-detectors G, for convenience. However, it should be noted that the area of the two-color photo-detector R/B can be equivalent to the area of only one of the single-color photo-detectors G, with no significant change in transistor or photodiode layout.

In the example shown in FIG. 5, the two-color photo-detector R/B includes a magenta filter, so that only the red and blue portions of the spectrum are passed to the two photo-detector elements 12 and 13. However, it should be understood that other filters may be used depending on the color space and color sampling desired for the sensor. In addition, no color filter may be used, and the color response of the two-color photo-detector R/B may be tuned, as discussed above in connection with FIG. 1. As discussed above in connection with FIG. 1, the upper photo-detector element 12 of the two-color photo-detector R/B is formed of a single layer of the appropriate thickness of amorphous silicon (αSi:H) in order to absorb the blue portion of the spectrum and pass the red portion of the spectrum to the lower photo-detector element 13 of the two-color photo-detector. The lower photo-detector element 13 of the two-color photo-detector resides in bulk silicon.

As in FIG. 1, green filters are used above the two single-color photo-detectors G of FIG. 5. Thus, the green filters absorb the blue and red portions of the spectrum, while passing the green portion of the spectrum to the green photo-detector elements 21 and 22. In addition, each green photo-detector element is also made up of an elevated layer of amorphous silicon. The thickness of the amorphous silicon layer of the green photo-detector elements is chosen such that the amorphous silicon layer absorbs only the green portion of the spectrum. The green photo-detectors G further supply the area for all of the driver MOSFETs for the single-color photo-detectors G and the two-color photo-detector R/B. As in FIG. 1, the driver MOSFETs for FIG. 5 are implemented in the bulk silicon under the green photo-detector elements.

Figure 6:
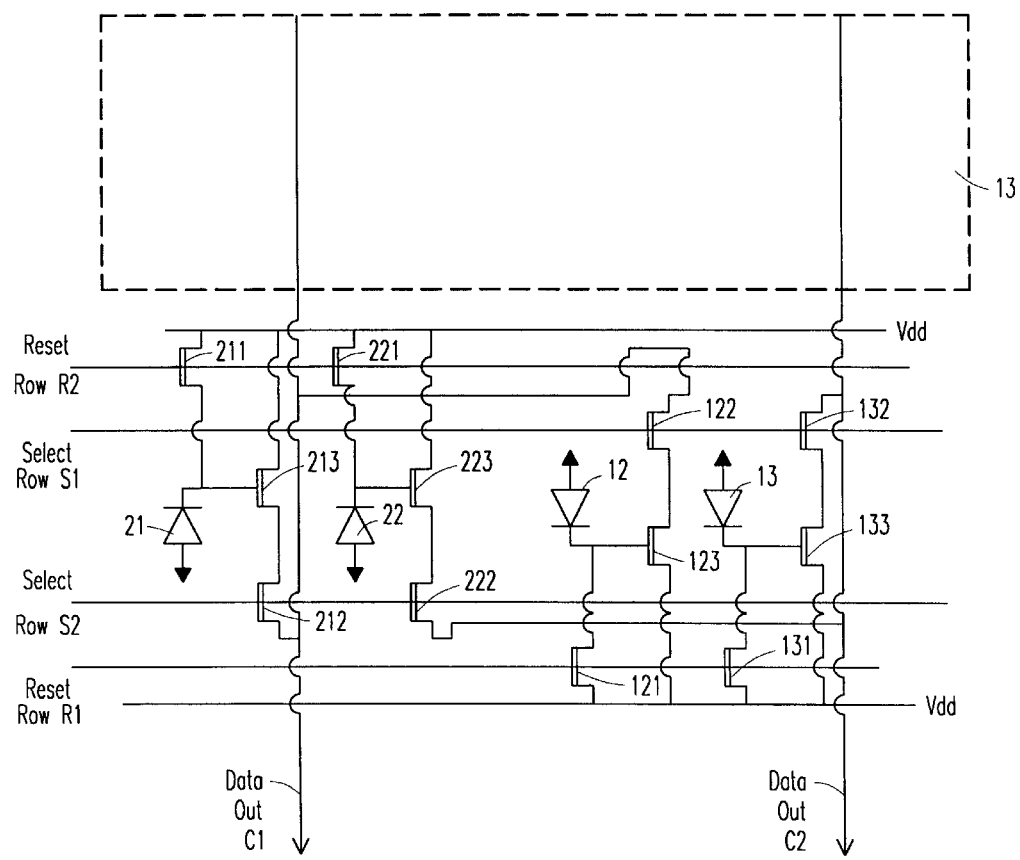
FIG. 6 is an exemplary circuit schematic of the image sensor shown in FIG. 5.

The sensor shown in FIG. 5, with two single-color photo-detectors G and one two-color photo-detector R/B, needs approximately twelve MOSFET's to drive all of the photodiodes. An exemplary circuit schematic of the transistors needed to drive the sensor of FIG. 5 is shown in FIG. 6. The circuit schematic is shown implemented in the bulk silicon of the sensor. Therefore, the location of the lower photo-detector element 13 (bulk photodiode) of the two-color photo-detector with respect to the circuitry is illustrated.

Reset MOSFETs 121, 131, 211 and 221 serve to reset photodiodes 12, 13, 21 and 22, respectively, whereas selector MOSFETs 122, 132, 212 and 222 serve to select photodiodes 12, 13, 21 and 22, respectively. Amplifier MOSFETs 123, 133, 213 and 223 serve to amplify the signals from photodiodes 12, 13, 21 and 22, respectively. A supply voltage (Vdd) is provided to bias the reset and amplifier MOSFETs.

As described above, when the voltage of photodiodes 12 and 13 is reset by applying a signal to reset line R1, which is connected to the gates of reset MOSFETs 121 and 131, respectively, light impinging on the photodiodes 12 and 13 causes the photodiodes 12 and 13 to accumulate charge. The accumulated charge reduces the voltage over time, so that when a signal is applied to select line S1, which is connected to the gates of selector MOSFETs 122 and 132, voltages related to the photodiode voltages associated with photodiodes 12 and 13 are transferred to storage capacitors (not shown) via respective column data lines C1 and C2. Thereafter, the photodiodes 12 and 13 are reset again, and the reset voltages are transferred to other storage capacitors (not shown). The difference between the photodiode voltage and the reset voltage is then provided to an analog-to-digital converter (not shown) for processing.

Likewise, to read the data from photodiodes 21 and 22, a signal is applied to reset line R2 of reset MOSFETs 211 and 221 to reset photodiodes 21 and 22, and after a subsequent integration time, a signal is applied to the select line S2 of selector MOSFETs 212 and 222. The photodiode voltages from photodiodes 21 and 22 are then transferred to the storage capacitors on respective column data lines C1 and C2.

Figure 7:
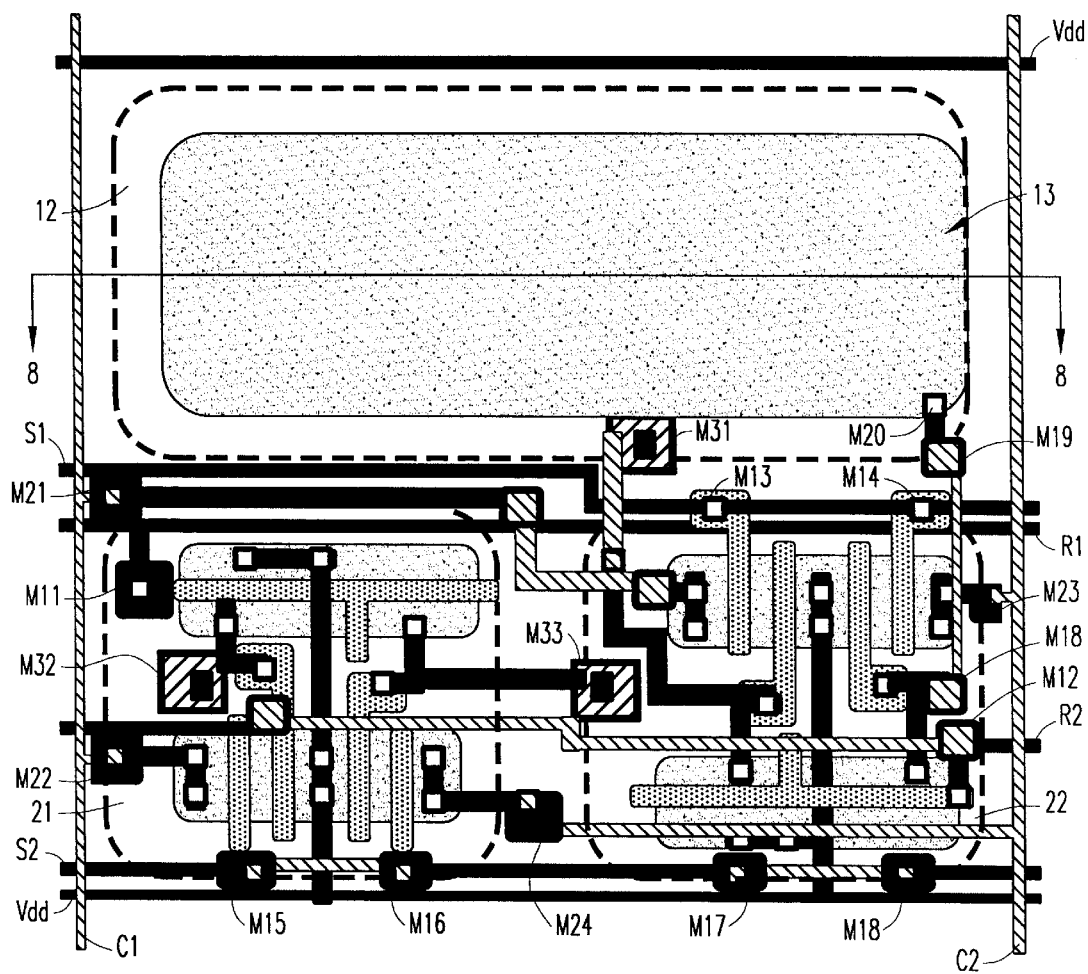
FIG. 7 illustrates an exemplary layout of the image sensor shown in FIGS. 5 and 6.

An exemplary layout for the sensor shown in FIG. 5 is illustrated in FIG. 7. The dashed lines represent elevated photodiodes 12, 21 and 22. The shaded areas represent diffusion regions, where the source and drain of all twelve MOSFETs and the lower photo-detector element (photodiode) of the two-color photo-detector are formed. As in FIG. 4 above, three layers of metal (metal 1, metal 2 and metal 3) are illustrated in FIG. 7. Metal 1 is represented by solid lines, metal 2 is represented by left-hatched lines and metal 3 is represented by right-hatched areas. In addition, polysilicon gates to each of the twelve MOSFETs are illustrated by dotted areas.

Metal contacts M31, M32 and M33 provide a connection between elevated photodiodes 12, 21 and 22, respectively, and the polysilicon gates of amplifier MOSFETs 123, 213 and 223 (shown in FIG. 6), respectively. Metal contacts M31, M32 and M33 further provide a connection between metal 1, metal 2 and metal 3. Metal contacts M18, M19 and M20 provide the signal from lower photo-detector element 13 to the polysilicon gate of amplifier MOSFET 133 (shown in FIG. 6). In addition, metal contacts M18 and M19 serves as a metal 1 to metal 2 contacts. All metal contacts shown are not discussed, for simplicity.

Reset lines R1 and R2 and select lines S1 and S2 are formed of metal 1 (solid lines) and metal 2 (left-hatched lines) to avoid intersecting crossing lines from the supply voltage (Vdd), as is shown. Reset line R1 connects to the polysilicon gates of reset MOSFETs 121 and 131 (shown in FIG. 6) via metal contact M11. Reset line R2 connects to the polysilicon gates of MOSFETs 211 and 221 (shown in FIG. 6) via metal contact M12, respectively. Select reset line S1 connects to the polysilicon gates of MOSFETs 122 and 132 (shown in FIG. 6) via metal contacts M13 and M14, respectively, and select reset line S2 connects to the polysilicon gates of MOSFETs 212 and 222 (shown in FIG. 6) via metal contacts M15 and M16, respectively. In addition, metal contacts M12, M15 and M16 also connect metal 1 to metal 2, as shown.

Column data lines C1 and C2 are formed of metal 2. Data is placed on column data line C1 from photodiodes 12 and 21 via metal contacts M21 and M22, respectively. Similarly, data is placed on column data line C2 from photodiodes 11 and 22 via metal contacts M23 and M24, respectively. Metal contacts M21, M22, M23 and M24 further serve as metal 1 to metal 2 contacts. It should be understood that alternative circuit schematics and layouts may be possible, and that the circuit schematic and layout shown in FIGS. 6 and 7 is included merely for illustrative purposes.

Figure 8:
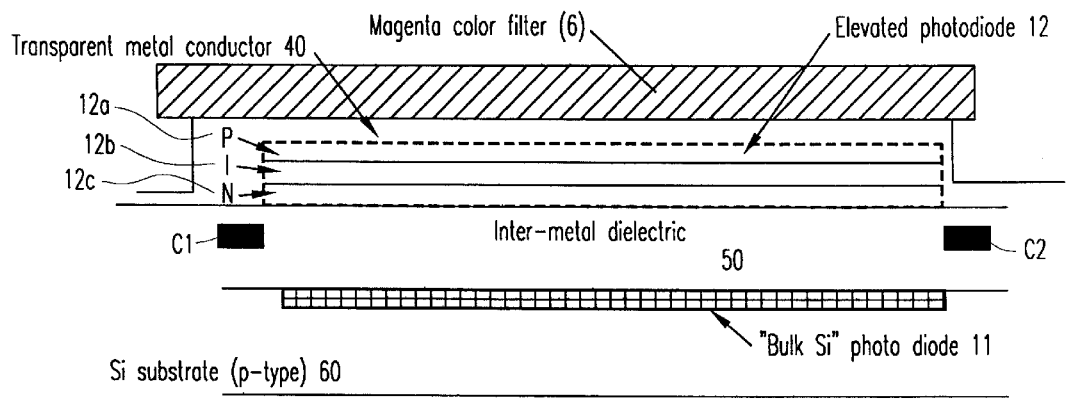
FIG. 8 is an exemplary cross-sectional view of the two-color photo-detector shown in FIG. 7.

FIG. 8 is a cross-sectional view of an exemplary two-color photo-detector R/B of the type shown in FIG. 7. A magenta color filter 6 resides above a transparent metal conductor 40, such as indium tin oxide. Below the transparent metal conductor 40 is an elevated photodiode 12 having a P-layer 12a, an I-layer 12b and an N-layer 12c. When reverse biased, the elevated photodiode 12 accumulates charge, reducing the reverse bias, when it receives light.

A dielectric 50 (illustrated as an inter-metal dielectric), such as silicon dioxide ($SiO_2$), separates the elevated photodiode from the bulk silicon photodiode 13. The dielectric 50 separates the anodes of two photodiodes 12 and 13 in order to separate the current coming out of each of the two photodiodes 12 and 13. The bulk silicon photodiode 13 is formed in the silicon substrate 60. A shallow N+ region is formed in the P-type silicon substrate 60 to provide detection of light having wavelengths that are longer than the wavelength of light detected by the elevated photodiode 12. Also shown in FIG. 8 is the relative position of the column data lines C1 and C2, discussed above in connection with FIG. 7. An N-well diode could also be used, as known in the art.

Figure 9:
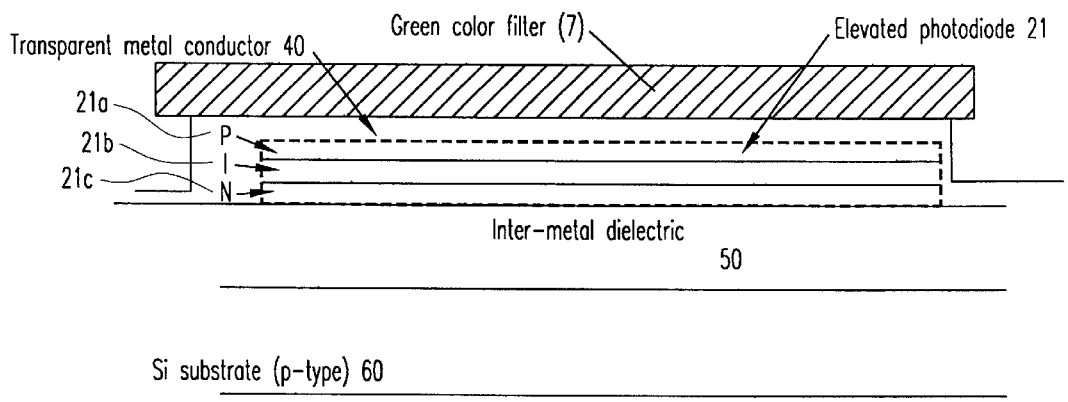
FIG. 9 is an exemplary cross-sectional view of the single-color photo-detector shown in FIGS. 1 and 5.

FIG. 9 is a cross-sectional view of an exemplary single-color photo-detector G of the type shown in FIGS. 1 and 5. A green color filter 7 resides above a transparent metal conductor 40, such as indium tin oxide. Below the transparent metal conductor 40 is an elevated photodiode 21, which includes a P-layer 21a, an I-layer 21b and an N-layer 21c. An inter-metal dielectric 50, such as silicon dioxide (SiO$_2$) separates the elevated photodiode 21 from the silicon substrate 60, which houses at least part of the circuitry for driving the green photo-detector 21 and the two-color photo-detector 11 and 12 shown in FIG. 8. The N-type field-effect transistors for driving the photodiodes are not shown in FIG. 9. However, it should be understood that standard CMOS processing can be used to define the P-well and N+ source/drain regions of the MOSFETs.

It should be understood that the combination of a two-color photo-detector and a single-color photo-detector can be applied to any repeat unit, including any number of two-color photo-detectors and single-color photo-detectors. In addition, as a result of integrating at least part of the circuitry for an elevated two-color photo-detector under one or more single-color photo-detectors, a smaller (less expensive) two-color photo-detector can be produced, thereby improving the spatial resolution of the sensor. Furthermore, since the two photodiodes of the two-color photo-detector are electrically isolated (by the inter-metal dielectric layer shown in FIG. 8), the dynamic range of each photodiode is improved due to the fact that each photodiode can "swing" the full supply voltage (Vdd).

As will be recognized by those skilled in the art, the innovative concepts described in the present application can be modified and varied over a wide range of applications. Accordingly, the scope of patented subject matter should not be limited to any of the specific exemplary teachings discussed, but is instead defined by the following claims.

We claim:

1. A digital image sensor, comprising:
   a two-color photo-detector having a first photo-detector element in an elevated relation with a second photo-detector element, said first photo-detector element being electrically isolated from said second photo-detector element, said first photo-detector being capable of accumulating charge upon reception of light within a first range of wavelengths and said second photo-detector being capable of accumulating charge upon reception of light within a second range of wavelengths; and
   a single-color photo-detector having a third photo-detector element capable of accumulating charge upon reception of light within a third range of wavelengths.

2. The sensor of claim 1, further comprising:
   circuitry for driving said first and second photo-detector elements, said third photo-detector element being in an elevated relation with at least a part of said circuitry.

3. The sensor of claim 2, wherein said circuitry comprises drive transistors for driving said first and second photo-detector elements, said drive transistors being below said third photo-detector element.

4. The sensor of claim 2, further comprising:
   a substrate, said second photo-detector element and at least part of said circuitry being formed within said substrate.

5. The sensor of claim 4, further comprising:
   a first dielectric between said first photo-detector element and said substrate; and
   a second dielectric between said third photo-detector element and said substrate.

6. The sensor of claim 5, wherein said first photo-detector element is formed of amorphous silicon having a thickness to absorb light within said first range of wavelengths and said third photo-detector element is formed of amorphous silicon having a thickness to absorb light within said third range of wavelengths.

7. The sensor of claim 2, wherein said circuitry comprises one or more transistors for driving said first, second and third photo-detector elements.

8. The sensor of claim 7, wherein said one or more transistors comprises first and second reset transistors for resetting said first and second photo-detector elements, respectively, first and second selector transistors for selecting said first and second photo-detector elements, respectively, and first and second amplifier transistors for amplifying respective signals received from said first and second photo-detector elements.

9. The sensor of claim 7, wherein said one or more transistors are field-effect transistors.

10. The sensor of claim 2, further comprising:
    at least one additional single-color photo-detector having a fourth photo-detector element capable of accumulating charge upon reception of light within said third range of wavelengths; and
    additional circuitry for driving said third photo-detector element and said fourth photo-detector element, said third photo-detector element and said fourth photo-detector element being in an elevated relation with said additional circuitry.

11. The sensor of claim 10, further comprising:
    an array of photo-detectors having a repeat unit comprising said two-color photo-detector, said single-color photo-detector and one of said at least one additional single-color photo-detector, said repeat unit being stepped and repeated throughout said array.

12. The sensor of claim 11, wherein the area of said two-color photo-detector is substantially equivalent to the combined area of said single-color photo-detector and said one additional single-color photo-detector.

13. The sensor of claim 10, wherein said at least one additional single-color photo-detector comprises first and second additional single-color photo-detectors, and further comprising:
    an array of photo-detectors having a repeat unit comprising said two-color photo-detector, said single-color photo-detector, said first additional single-color photo-detector and said second additional single-color photo-detector, said repeat unit being stepped and repeated throughout said array.

14. The sensor of claim 1, wherein said first, second and third photo-detector elements are selected from the group consisting of: photodiodes, photo-conductors or photo-transistors.

15. The sensor of claim 1, wherein said two-color photo-detector has a first color filter thereon and said single-color photo-detector has a second color filter different from said first color filter thereon.

16. A digital image sensor, comprising:
    a two-color photo-detector having a first photo-detector element in an elevated relation with a second photo-detector element, said first photo-detector element being electrically isolated from said second photo-detector element, said first photo-detector element being capable of accumulating charge upon reception of light within a first range of wavelengths and said second photo-detector element being capable of accumulating charge upon reception of light within a second range of wavelengths;
    a first single-color photo-detector having a third photo-detector element capable of accumulating charge upon reception of light within a third range of wavelengths; and circuitry for driving said first and second photo-detector elements, said third photo-detector element being in an elevated relation with at least a part of said circuitry.

17. The sensor of claim 16 further comprising:

at least one additional single-color photo-detector having a fourth photo-detector element capable of accumulating charge upon reception of light within said third range of wavelengths; and additional circuitry for driving said third photo-detector element and said fourth photo-detector element, said third photo-detector element and said fourth photo-detector element being in an elevated relation with said additional circuitry.

18. The sensor of claim 17, further comprising:

an array of photo-detectors, said array having a repeat unit comprising said two-color photo-detector, said single-color photo-detector and one of said at least one additional single-color photo-detector, said repeat unit being stepped and repeated throughout an array of photo-detectors.

19. The sensor of claim 18, wherein the area of said two-color photo-detector is substantially equivalent to the combined area of said single-color photo-detector and said one additional single-color photo-detector.

20. The sensor of claim 17, wherein said at least one additional single-color photo-detector comprises first and second additional single-color photo-detectors, and further comprising:

an array of photo-detectors having a repeat unit comprising said two-color photo-detector, said single-color photo-detector, said first additional single-color photo-detector and said second additional, single-color photo-detector, said repeat unit being stepped and repeated throughout said array of photo-detectors.

21. The sensor of claim 16, wherein said two-color photo-detector has a first color filter thereon and said single-color photo-detector has a second color filter different from said first color filter thereon.

* * * * *